(12) United States Patent
Camacho et al.

(10) Patent No.: US 9,059,151 B2
(45) Date of Patent: Jun. 16, 2015

(54) INTEGRATED CIRCUIT PACKAGING SYSTEM WITH ISLAND TERMINALS AND EMBEDDED PADDLE AND METHOD OF MANUFACTURE THEREOF

(75) Inventors: Zigmund Ramirez Camacho, Singapore (SG); Henry Descalzo Bathan, Singapore (SG); Emmanuel Espiritu, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 514 days.

(21) Appl. No.: 13/187,505

(22) Filed: Jul. 20, 2011

(65) Prior Publication Data
US 2012/0018865 A1 Jan. 26, 2012

Related U.S. Application Data
(60) Provisional application No. 61/366,154, filed on Jul. 20, 2010.

(51) Int. Cl.
| | | |
|---|---|---|
| *H01L 23/495* | (2006.01) | |
| *H01L 21/98* | (2006.01) | |
| *H01L 21/48* | (2006.01) | |
| *H01L 23/00* | (2006.01) | |

(52) U.S. Cl.
CPC ...... *H01L 21/4832* (2013.01); *H01L 23/49548* (2013.01); *H01L 2224/48247* (2013.01); *H01L 2224/73265* (2013.01); *H01L 2924/01046* (2013.01); *H01L 2924/01078* (2013.01); *H01L 2924/01079* (2013.01); *H01L 24/48* (2013.01); *H01L 2224/32245* (2013.01); *H01L 2924/1815* (2013.01)

(58) Field of Classification Search
USPC .......................................................... 438/123
See application file for complete search history.

(56) References Cited

U.S. PATENT DOCUMENTS

| | | | |
|---|---|---|---|
| 6,191,494 B1 | 2/2001 | Ooyama et al. | |
| 6,281,568 B1 | 8/2001 | Glenn et al. | |
| 2003/0178712 A1* | 9/2003 | Nakazawa | 257/676 |
| 2009/0230526 A1* | 9/2009 | Chen et al. | 257/676 |
| 2011/0049685 A1* | 3/2011 | Park et al. | 257/660 |
| 2011/0068463 A1 | 3/2011 | Camacho et al. | |

* cited by examiner

*Primary Examiner* — Fernando L Toledo
*Assistant Examiner* — Valerie N Newton
(74) *Attorney, Agent, or Firm* — Ishimaru & Associates LLP

(57) ABSTRACT

A method of manufacture of an integrated circuit packaging system includes: providing a leadframe having an upper structure, upper protrusions, and a base side facing away from the upper structure and the upper protrusions; forming tie bars in the leadframe with an opening surrounding the upper structure, the tie bars connected to the upper structure and exposed on the base side; connecting an integrated circuit to the upper protrusions; applying an encapsulant over the integrated circuit, over the upper structure, and in the opening with the base side exposed; removing the tie bars exposing a first surface and a second surface of the encapsulant below the first surface, and forming a die paddle from the upper structure and exposed from the second surface; and removing the leadframe from the base side forming island terminals from the upper protrusions exposed from the second surface and isolated from the die paddle.

10 Claims, 5 Drawing Sheets

INTEGRATED CIRCUIT PACKAGING SYSTEM WITH ISLAND TERMINALS AND EMBEDDED PADDLE AND METHOD OF MANUFACTURE THEREOF

CROSS-REFERENCE TO RELATED APPLICATION(S)

This application claims the benefit of U.S. Provisional Patent Application Ser. No. 61/366,154 filed Jul. 20, 2010, and the subject matter thereof is incorporated herein by reference thereto.

TECHNICAL FIELD

The present invention relates generally to an integrated circuit packaging system, and more particularly to a system with terminals.

BACKGROUND ART

Semiconductor chips have become progressively more complex, driven in large part by the need for increasing processing power in a smaller chip size for compact or portable electronic devices such as cell phones, smart phones, personal media systems, ultraportable computers.

There are a number of conventional processes for packaging integrated circuit (IC) dice. By way of example, many IC packages utilize a metallic leadframe that has been stamped or etched from a metal sheet to provide electrical interconnects to external devices. The die may be electrically connected to the leadframe by means of bonding wires, solder bumps or other suitable electrical connections.

In general, the die and portions of the leadframe are encapsulated with a molding material to protect the delicate electrical components on the active side of the die while leaving selected portions of the leadframe exposed to facilitate electrical connection to external devices.

In response to the smaller chip size, packaging technologies have evolved, for example, to enable an increased lead density, which can reduce the footprint area of a package mounted on a printed circuit board (PCB). Some packaging technologies may enable this increased lead density by providing rows of leads connected to a disposable portion of a leadframe.

However, manufacturing processes for such leadframes may not be scalable. As lead density requirements further increase, it may be desirable to use packaging technologies that are more scalable in terms of lead density.

Moreover, it may be desirable to further reduce package size in additional ways. At the same time, it may be desirable to maintain sufficient structural integrity and to facilitate surface mounting of the package to a PCB. It may also be desirable to formulate a packaging process designed to meet these objectives. Current packaging solutions can meet some of these objectives but may not be able to meet most, or all, of these objectives.

Thus, a need still remains for a high reliability package for use with high temperature processes. In view of this need, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a leadframe having an upper structure, upper protrusions, and a base side facing away from the upper structure and the upper protrusions; forming tie bars in the leadframe with an opening surrounding the upper structure, the tie bars connected to the upper structure and exposed on the base side; connecting an integrated circuit to the upper protrusions; applying an encapsulant over the integrated circuit, over the upper structure, and in the opening with the base side exposed; removing the tie bars exposing a first surface and a second surface of the encapsulant below the first surface, and forming a die paddle from the upper structure and exposed from the second surface; and removing the leadframe from the base side forming island terminals from the upper protrusions exposed from the second surface and isolated from the die paddle.

The present invention provides an integrated circuit packaging system, including: island terminals; a die paddle isolated from and surrounded by the island terminals; an integrated circuit connected to the die paddle and the island terminals; and an encapsulant over the integrated circuit device, the die paddle, and the island terminals, the die paddle below a first surface of the encapsulant, the island terminals and a portion of the die paddle exposed from the second surface of the encapsulant below the first surface.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
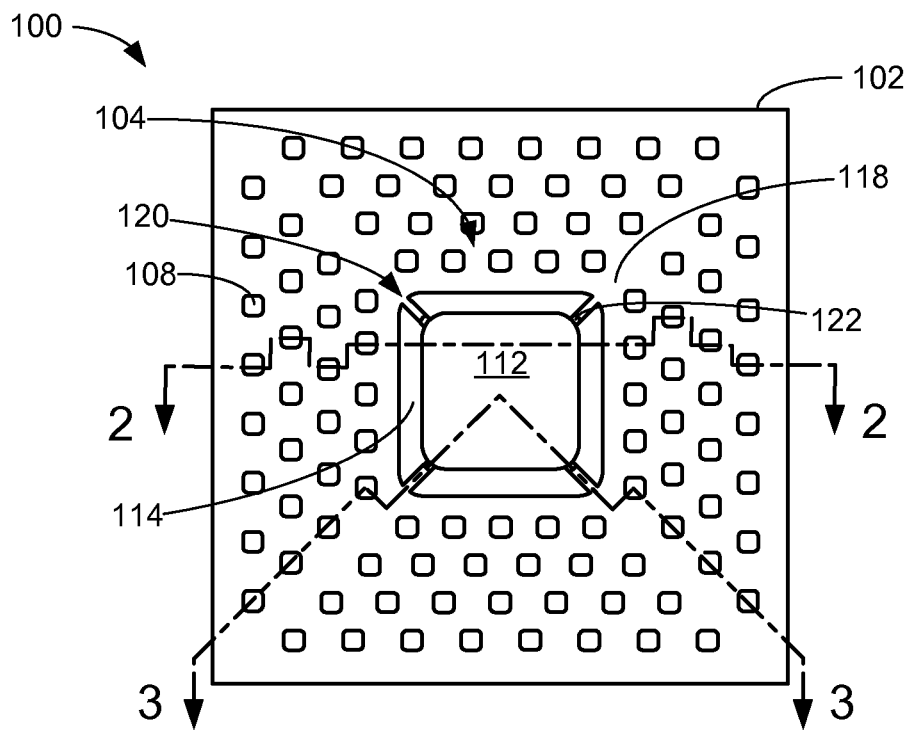
FIG. 1 is a bottom view of an integrated circuit packaging system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

The same numbers are used in all the drawing FIGs. to relate to the same elements. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Referring now to FIG. 1, therein is shown a bottom view of an integrated circuit packaging system 100 in an embodiment of the present invention. The integrated circuit packaging system 100 includes peripheral sides 102 formed from an encapsulant 104 used to protect, provide structural support, and hermetically seal contents of the integrated circuit packaging system 100.

Pad contacts 108 and a die paddle contact 112 are exposed below the encapsulant 104 enclosed by the peripheral sides 102. A conductive etch resistant material is used to form the pad contacts 108 and the die paddle contact 112.

The conductive etch resistant material can include nickel-palladium-gold or any conductive metal or alloys having properties equivalent to properties of nickel-palladium-gold. The pad contacts 108 and the die paddle contact 112 can be used to mount or electrically attach the integrated circuit packaging system 100 to a next level of integration (not shown) such as a printed circuit board, an integrated circuit component, or an electronic assembly.

For purposes of illustration, the die paddle contact 112 is shown surrounded by the pad contacts 108 and the die paddle contact 112 and the pad contacts 108 are shown having a shape of a rectangle with curved corners. It is understood that the pad contacts 108 or the die paddle contact 112 can have any shape or be formed with any offset or orientations to one another. For example, one or more of the pad contacts 108 can have a shape of an ellipse or the die paddle contact 112 can be offset closer to one of the peripheral sides 102.

The encapsulant 104 is shown having at least a first surface 114 and a second surface 118. The first surface 114 is elevated vertically above the second surface 118. It is understood that the encapsulant 104 can have more than two surfaces. For example, the encapsulant 104 can be formed having a third surface at a level vertically below the first surface 114 and vertically above the second surface 118.

The first surface 114 of the encapsulant 104 surrounds and exposes the die paddle contact 112. The first surface 114 can have at least two different surface segments. Ends of the surface segments can directly facing one another are separated by the second surface 118 below the first surface 114. The second surface 118 exposed between the ends of the surface segments of the first surface 114 and the second surface 118 can form a channel 120 in the first surface 114 of the encapsulant 104 and recessed in the encapsulant 104.

A portion of a die paddle 122 formed in contact with the die paddle contact 112 intersects and is exposed in the channel 120 between adjacent pairs of the surface segments. The die paddle 122 is formed of an etchable electrically conductive material such as copper or a copper alloy. The pad contacts 108 can be staggered from one another and formed in multiple rows along each of the peripheral sides 102 over the second surface 118.

For purposes of illustration, the first surface 114 is shown formed from four surface segments of the first surface 114 with ends of each of the surface segments separated at corners of the die paddle contact 112. It is understood that the first surface 114 can have more than two surface segments. For example, the first surface 114 can be formed having five surface segments by additionally bisecting one of the four surface segments with a different channel exposing the second surface 118.

It has been discovered that the channel 120 formed by the first surface 114 and the second surface 118 of the encapsulant 104 provides improved bonding of the die paddle 122 to a next level of integration by enabling venting or bleeding of excessive gas, liquid, or bonding materials that can include solder, adhesive, air, rosin, or other different materials thereby improving reliability.

It has been discovered that the pad contacts 108, staggered and in multiple rows, maximizes the input and output connectivity for any sized footprint of the integrated circuit packaging system 100.

Figure 2:
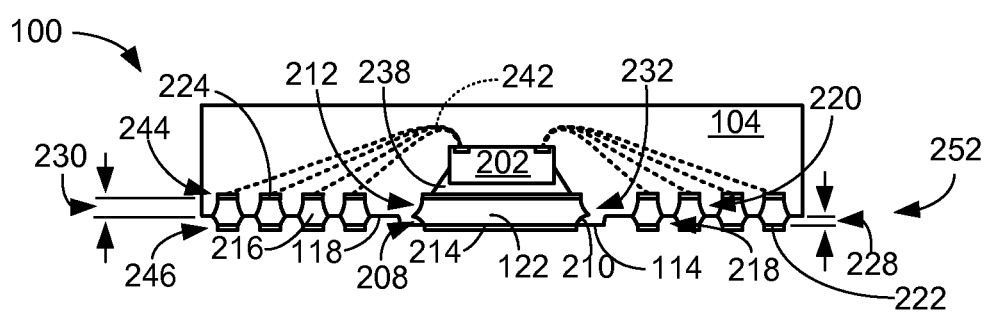
FIG. 2 is a cross-sectional view of the integrated circuit packaging system across line 2-2 of FIG. 1.

Referring now to FIG. 2, therein is shown a cross-sectional view of the integrated circuit packaging system 100 across line 2-2 of FIG. 1. An integrated circuit 202 having active integrated circuitry such as a wire bond chip, a flip chip, or an integrated circuit module, is shown mounted over the die paddle 122 etched and partially covered with the conductive etch resistant material.

The die paddle 122 provides the integrated circuit packaging system 100 with structural support, enhanced thermal dissipation, improved ground/signal isolation, an attachment surface area for the integrated circuit packaging system 100 to connect to a next level of integration.

The die paddle 122 includes a first paddle section 208 and a second paddle section 212 integral with the first paddle section 208. An inward paddle surface of the second paddle section 212 faces the integrated circuit 202. The die paddle contact 112 of FIG. 1 covers and directly contacts, with no intervening material, an outward paddle surface 214 of the first paddle section 208 of the die paddle 122. The first paddle section 208 faces away from the integrated circuit 202.

The second paddle section 212 has concave surfaces between the inward paddle surface and the first paddle section 208. The first paddle section 208 has an undercut surface 210 between the outward paddle surface 214 and the second paddle section 212. The undercut surface 210 is defined as a curved surface having a length at least two and one-half times greater than a width of the curved surface.

Island terminals 216 are isolated from and surround the die paddle 122 and can be formed of the etchable electrically conductive material of the die paddle 122 or of a material having properties similar to properties of the etchable electrically conductive material. The island terminals 216 are laterally aligned with one another and with the die paddle 122.

The island terminals 216 includes a first island section 218 and a second island section 220 integral with the first island section 218. An outward island surface 222 of the first island section 218 can be coplanar with the outward paddle surface 214. The pad contacts 108 of FIG. 1 covers and directly contacts the outward island surface 222 of the first island section 218.

The conductive etch resistant material covers an inward island surface 224 of the second island section 220. The inward island surface 224, facing away from the outward island surface 222, can be coplanar with the inward paddle surface.

The second island section 220 have concave surfaces between the inward island surface 224 and the first island section 218. The first island section 218 have different concave surfaces between the outward island surface 222 and the second island section 220.

The first island section 218 and the first paddle section 208 can be formed having a standoff height 228. The standoff height 228 is defined as a minimum vertical distance from the outward island surface 222 or the outward paddle surface 214 to the second surface 118 of the encapsulant 104.

The second island section 220, inserted in the second surface 118 of the encapsulant 104, can be formed having an insertion depth 230. The insertion depth 230 is defined as a minimum vertical distance from the second surface 118 of the encapsulant 104 to the inward island surface 224 within the encapsulant 104. The insertion depth 230 is fifty to ninety percent greater than the standoff height 228.

Portions of the undercut surface 210 of the die paddle 122 are enclosed or covered in the encapsulant 104 by the first surface 114. The outward paddle surface 214 can be and coplanar with the first surface 114 of the encapsulant 104. An anchor depth 232 of the die paddle 122 is defined as the summation of the standoff height 228 and the insertion depth 230.

An adhesive 238 can be used to attach or mount the integrated circuit 202 to the conductive etch resistant material covering the inward paddle surface. The adhesive 238 can include an adhesive layer, a stacking adhesive, or a combination thereof.

Conductors 242 such as bonding wires, solder bumps or other suitable electrical connectors, shown with dotted lines, can be used to directly connect or attach circuitry of the integrated circuit 202 with the conductive etch resistant material directly on the inward island surface 224 of the second island section 220. The wires provide electrical connectivity between the circuitry of the integrated circuit 202 and the island terminals 216.

The conductive etch resistant material directly on the inward island surface 224 of the second island section 220 and directly on the inward paddle surface of the second paddle section 212 can be referred to as an outlined patterned layer 244. The outlined patterned layer 244 can be formed vertically and directly above a base patterned layer 246.

The base patterned layer 246 refers to all of the pad contacts 108 of FIG. 1 and the die paddle contact 112 of FIG. 1. The outlined patterned layer 244 can also include outlined shapes having shapes identical to outlined shapes of the base patterned layer 246.

The encapsulant 104 surrounds the second island section 220, the second paddle section 212, and covers covered portions of the first paddle section 208. The first island section 218 and exposed portions of FIG. 3 of the first paddle section 208 are exposed from the encapsulant 104.

The island terminals 216, the die paddle 122, the outlined patterned layer 244, the pad contacts 108, and the die paddle contact 112 can be referred to as a package connection assembly 252. The package connection assembly 252 provides all connectivity between the contents of the integrated circuit packaging system 100 and any next level of integration.

It has been discovered that the encapsulant 104 surrounding the first paddle section 208 and the second paddle section 212 eliminates separation of the die paddle 122 from the encapsulant 104 thereby increasing reliability.

It has been discovered that the die paddle 122 with the undercut surface 210 enclosed by the encapsulant 104, having the anchor depth 232, or a combination thereof, eliminates movement of the die paddle 122 within the integrated circuit packaging system 100 thereby increasing reliability.

It has been discovered that the die paddle 122 with the undercut surface 210 enclosed by the encapsulant 104, having the anchor depth 232, or a combination thereof, provides superior hermetic sealing of the integrated circuit packaging system 100 to prevent any contamination of the integrated circuit 202 or the conductors 242.

It has been discovered that the concave surfaces on the second island section 220 of the island terminals 216 improves the reliability of the integrated circuit packaging system 100 by eliminating lead pull-out.

It has been discovered that the encapsulant 104 surrounding the first paddle section 208 and the second paddle section 212 improves thermal dissipation performance of the integrated circuit packaging system 100 by providing greater surface area contact between the die paddle 122 and the encapsulant 104.

It has been discovered that the standoff height 228 provided by the second surface 118 of the encapsulant 104 provides substantially improved bonding of the die paddle 122 to a next level of integration by enabling venting or bleeding of excessive gas, liquid, or bonding materials that can include solder, adhesive, air, rosin, or other different materials.

It has been discovered that the standoff height 228 improves convection and forced air flow around the island terminals 216 and over the second surface 118 of the encapsulant to provide substantially improved thermal dissipation, electrical performance, reliability, or combinations thereof.

It has been discovered that having the insertion depth 230 fifty to ninety percent greater than the standoff height 228 provides substantial pullout or movement resistance to the island terminals 216.

It has been discovered that the die paddle 122 with portions of the undercut surface 210 enclosed by the encapsulant 104 provides a very robust die pad pullout construction solution for different types of integrated circuit packages that include quad flat nolead standoff terminals, standard quad flat nolead, standoff quad flat nolead, or dual row quad flat nolead packages.

It has been discovered that the die paddle 122 with the undercut surface 210 and the second paddle section 212 enclosed by the encapsulant 104 eliminates die paddle detachment when subjected to high-temp situations that include assembly processes, end-user applications, end-user environments, unavoidable surface mount technology high temperatures, or any combination thereof.

Figure 3:
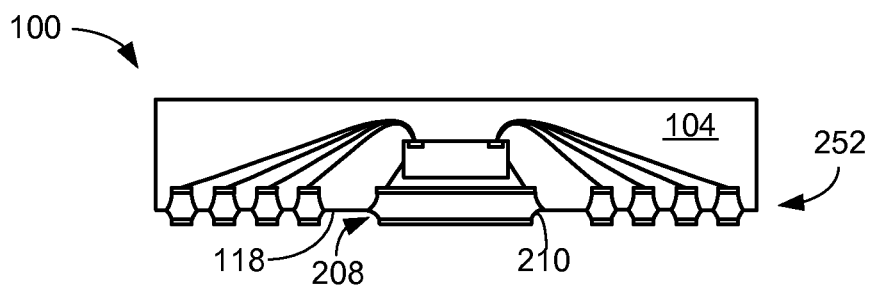
FIG. 3 is a cross-sectional view of the integrated circuit packaging system across line 3-3 of FIG. 1.

Referring now to FIG. 3, therein is shown a cross-sectional view of the integrated circuit packaging system 100 across line 3-3 of FIG. 1. The cross-sectional view shows the package connection assembly 252 with portions of the undercut surface 210 exposed from the second surface 118 between the ends of segments of FIG. 1 formed from the first surface 114.

Figure 4:
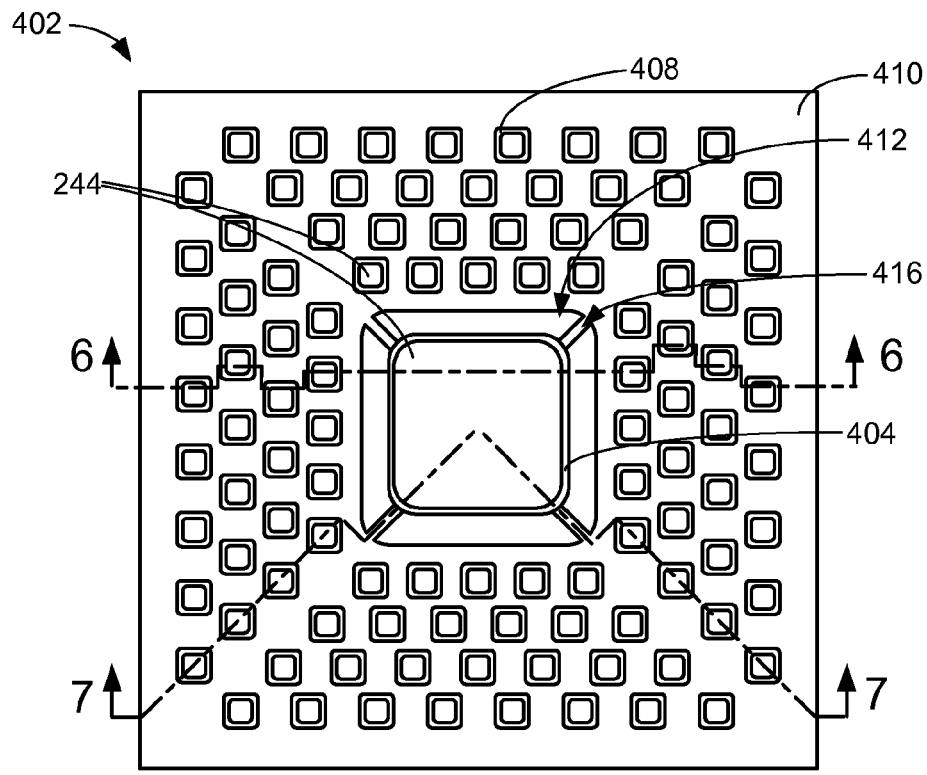
FIG. 4 is a top view of a leadframe used in the manufacturing of the integrated circuit packaging system during a top removal phase.

Referring now to FIG. 4, therein is shown a top view of a leadframe 402 used in the manufacturing of the integrated circuit packaging system 100 during a top removal phase. The leadframe 402 is made of the etchable electrically conductive material and covered with the outlined patterned layer 244 during a covering phase. The covering phase can include a plating process, a vacuum deposition process, a mask removal process, a masking process, or any process combination thereof.

The top removal phase can be used to form an upper structure 404 and upper protrusions 408 by removing surface material from the leadframe 402 equivalent to the insertion depth 230 of FIG. 2. The top removal phase can include an etching process, a cleaning process, a masking process, a drying process, or any process combination thereof. The surface material removed from the leadframe 402 forms a lowered surface 410 on the leadframe 402. The lowered surface 410 is integral with the upper structure 404 and the upper protrusions 408 above the lowered surface 410.

The upper structure 404 and the upper protrusions 408 can have relative sizes, shapes, orientations, and locations identical to relative sizes, shapes, orientations, and locations of the second paddle section 212 of FIG. 2 and the second island section 220 of FIG. 2, respectively. The leadframe 402 also includes an opening 412, such as a slot or a hole, formed through the conductive frame surrounding the upper structure 404 during the top removal phase.

The opening 412 includes tie bars 416 used to support or connect the upper structure 404 and the leadframe 402 and formed during the top removal phase. The tie bars 416 and regions of the leadframe 402 surrounding and integral with the upper protrusions 408 have a thickness that can equal to the standoff height 228 of FIG. 2. The upper structure 404 and the upper protrusions 408 have a thickness equal that can equal to the insertion depth 230.

Figure 5:
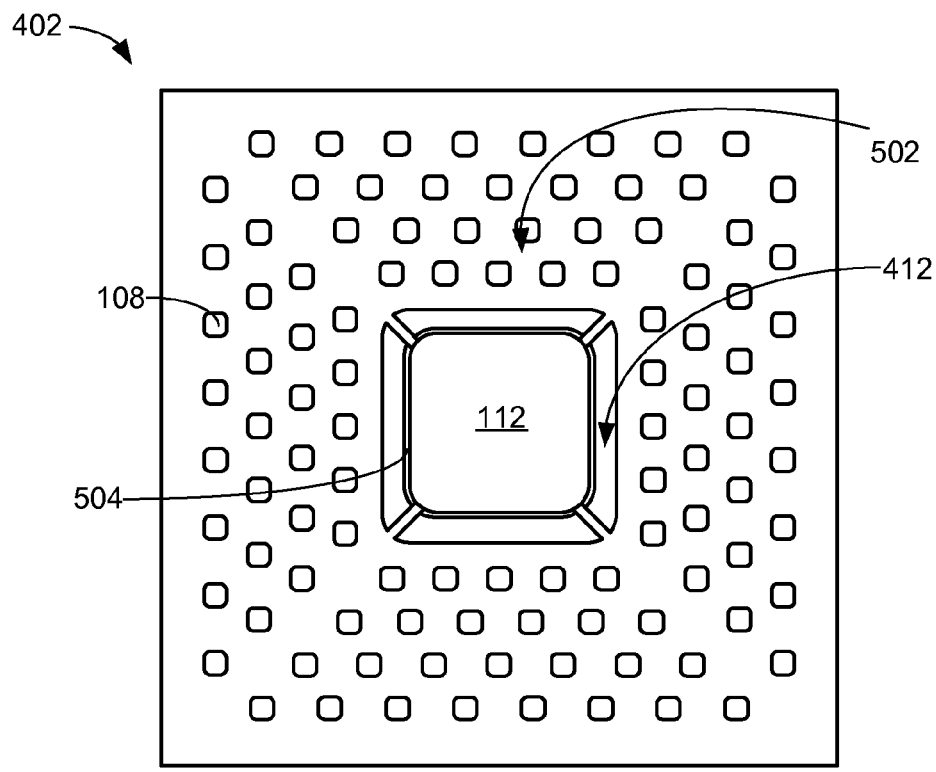
FIG. 5 is a bottom view of the leadframe of FIG. 4.

Referring now to FIG. 5, therein is shown a bottom view of the leadframe 402 of FIG. 4. Shown is a base side 502 on the lowered surface 410 of FIG. 4 of the leadframe 402 having a planar surface covered with the pad contacts 108 and the die paddle contact 112 of the base patterned layer 246 of FIG. 2. The base side 502 is opposite and facing away from a side of the lowered surface 410 having the upper structure 404 of FIG. 4 and the upper protrusions 408 of FIG. 4.

The opening 412 formed through the base side 502 is shown surrounding the die paddle contact 112. The opening 412 can be further etched using a removal process to provide a shaped surface 504 identical to the undercut surface 210 of FIG. 2 in portions of the opening 412 intersecting the die paddle contact 112. The removal process can include an etching process, a masking process, a cleaning process, a drying process, or any process combination thereof.

Figure 6:
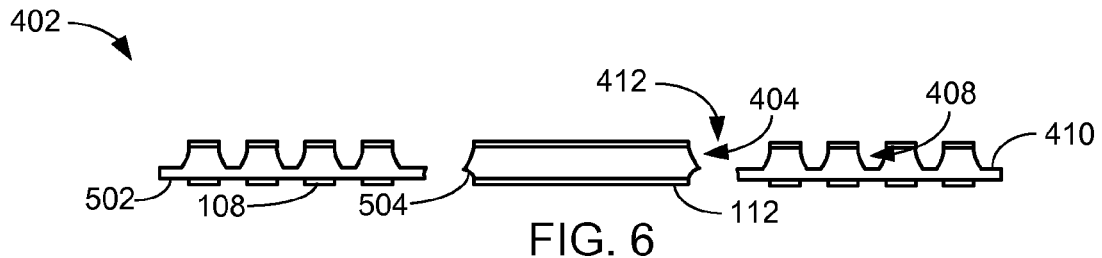
FIG. 6 is a cross-sectional view of the leadframe across line 6-6 of FIG. 4.

Referring now to FIG. 6, therein is shown a cross-sectional view of the leadframe 402 across line 6-6 of FIG. 4. The shaped surface 504 is shown intersecting the opening 412. The pad contacts 108 and the die paddle contact 112 are shown horizontally aligned on the base side 502. The upper structure 404 and the upper protrusions 408 are shown integral with the lowered surface 410 opposite the base side 502 of the leadframe 402.

Figure 7:
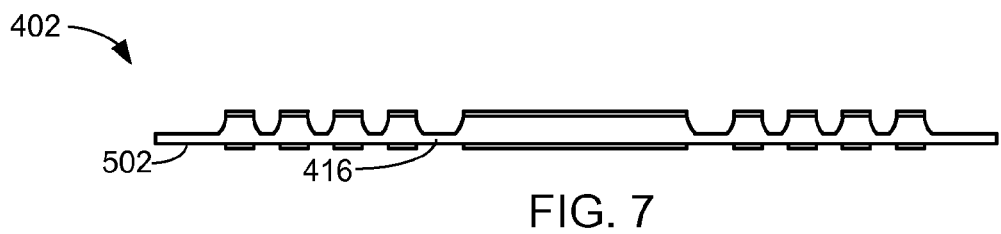
FIG. 7 is a cross-sectional view of the leadframe across line 7-7 of FIG. 4.

Referring now to FIG. 7, therein is shown a cross-sectional view of the leadframe 402 across line 7-7 of FIG. 4. A side of the tie bars 416 is coplanar with the base side 502 and integral with the leadframe 402.

Figure 8:
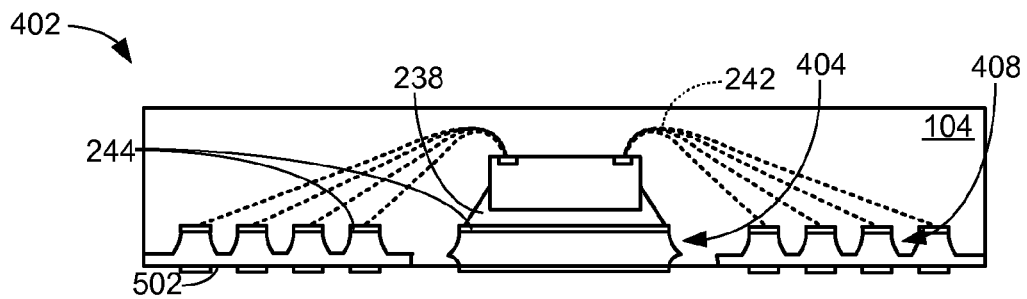
FIG. 8 is the cross-sectional view of FIG. 6 during a molding phase.

Referring now to FIG. 8, therein is shown the cross-sectional view of FIG. 6 during a molding phase. The integrated circuit 202 is attached to a portion of the outlined patterned layer 244 on the upper structure 404 using the adhesive 238 during a die attachment phase that can include a cleaning process, a heating process, a cooling process, a layering process, an injection process, or any combination thereof.

The conductors 242, shown with dotted lines, can be connected to a portion of the outlined patterned layer 244 on the upper protrusions 408 and the integrated circuit 202 using a connecting phase that can include a wire bonding process, a heating process, a cooling process, a reflow process, a thermo-compression process, or any combination thereof.

The encapsulant 104 covers the conductors 242, the integrated circuit 202, the lowered surface 410 of FIG. 6, fills the opening 412 of FIG. 6, covers a portion of the shaped surface 504 of FIG. 6, and surrounds the upper structure 404 and the upper protrusions 408 during the molding phase. The molding phase can include a mold chase, a heating process, a cooling process, an injection process, a cleaning process, or any combination thereof. The base side 502 is exposed from the encapsulant 104 during the molding phase.

Figure 9:
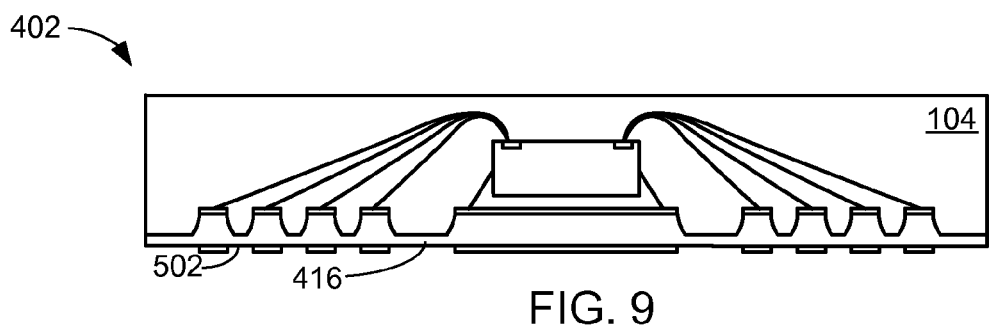
FIG. 9 is the cross-sectional view of FIG. 7 during the molding phase.

Referring now to FIG. 9, therein is shown the cross-sectional view of FIG. 7 during the molding phase. The side of the tie bars 416 planar with the base side 502 is exposed from the encapsulant 104 during the molding phase.

Figure 10:
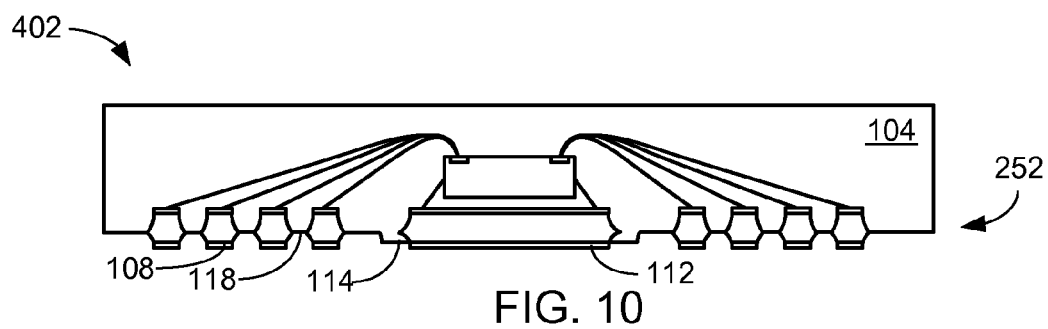
FIG. 10 is the cross-sectional view of FIG. 8 during a bottom removal phase.

Referring now to FIG. 10, therein is shown the cross-sectional view of FIG. 8 during a bottom removal phase. The base side 502 of FIG. 8 between the pad contacts 108 and the die paddle contact 112 and between each of the pad contacts 108 is removed to expose the encapsulant 104. The removal of the base side 502 forms the island terminals 216 of FIG. 2 and the die paddle 122 of FIG. 1 during a bottom removal phase. The bottom removal phase can include an etching process, a grinding process, a drilling, a masking process, a cleaning process, an unmasking process, or any combination thereof.

The package connection assembly 252, including the first surface 114 of FIG. 2 surrounding the die paddle 122 and the second surface 118 of FIG. 2 surrounding the island terminals 216, is formed during the bottom removal phase. Sides of the encapsulant 104 can be further processed for fit and finish using a finishing phase to form the integrated circuit packaging system 100 as shown in FIG. 2. The finishing phase can include a grinding process, a polishing process, a sanding process, or any combination thereof.

Figure 11:
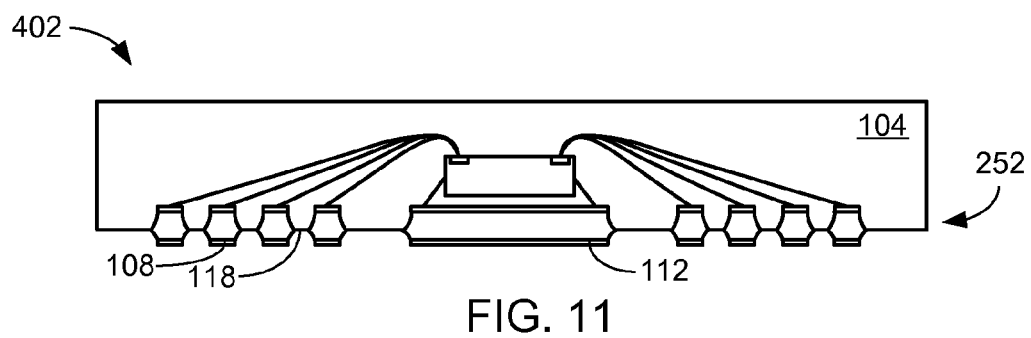
FIG. 11 is the cross-sectional view of FIG. 9 during the bottom removal phase.

Referring now to FIG. 11, therein is shown the cross-sectional view of FIG. 9 during the bottom removal phase. The base side 502 of FIG. 9 between the pad contacts 108 and the die paddle contact 112 and between each of the pad contacts 108 is removed to expose the encapsulant 104 and to remove the tie bars 416 of FIG. 9 during the bottom removal phase. The removal of the base side 502 forms the island terminals 216 of FIG. 2 and the die paddle 122 of FIG. 1 during the bottom removal phase.

The bottom removal phase exposes portions of the first paddle section 208 and the second surface 118 between the segments of the first surface 114 of FIG. 10 to form the package connection assembly 252. Sides of the encapsulant 104 can be further processed for fit and finish using a finishing phase to form the integrated circuit packaging system 100 as shown in FIG. 3. The finishing phase can include a grinding process, a polishing process, a sanding process, or any combination thereof.

Figure 12:
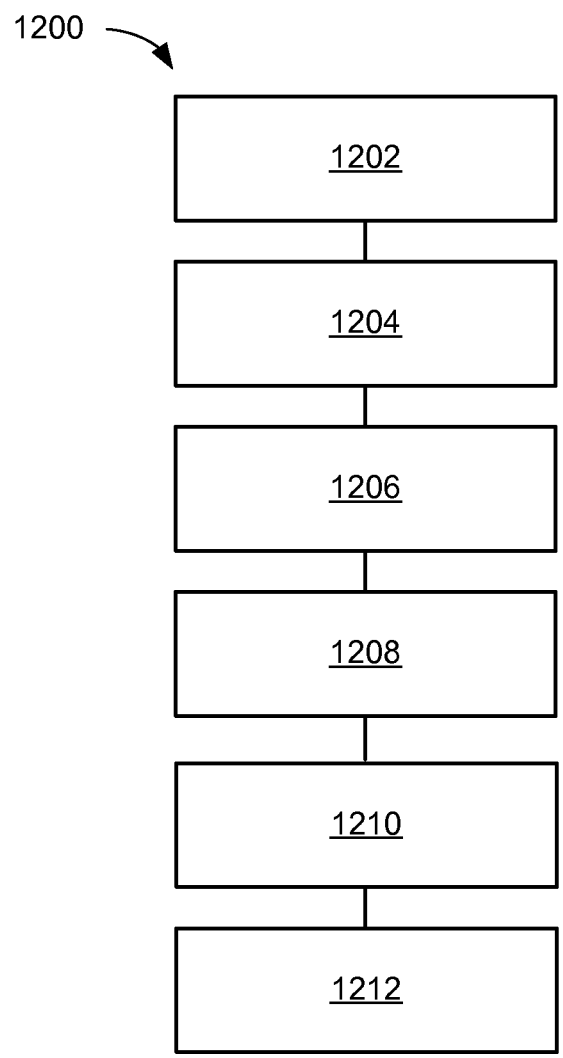
FIG. 12 is a flow chart of a method of manufacture of the integrated circuit packaging system in a further embodiment of the present invention.

Referring now to FIG. 12, therein is shown a flow chart of a method 1200 of manufacture of the integrated circuit packaging system 100 in a further embodiment of the present invention. The method 1200 includes: providing a leadframe having an upper structure, upper protrusions, and a base side facing away from the upper structure and the upper protrusions in a block 1202; forming tie bars in the leadframe with an opening surrounding the upper structure, the tie bars connected to the upper structure and exposed on the base side in a block 1204; connecting an integrated circuit to the upper protrusions in a block 1206; applying an encapsulant over the integrated circuit, over the upper structure, and in the opening with the base side exposed in a block 1208; removing the tie bars exposing a first surface and a second surface of the encapsulant below the first surface, and forming a die paddle from the upper structure and exposed from the second surface in a block 1210; and removing the leadframe from the base side forming island terminals from the upper protrusions exposed from the second surface and isolated from the die paddle in a block 1212.

Thus, it has been discovered that the integrated circuit packaging system with the present invention furnishes important and heretofore unknown and unavailable solutions, capabilities, and functional aspects. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto set forth herein or shown in the accompanying drawings are to be interpreted in an illustrative and non-limiting sense.

What is claimed is:

1. A method of manufacture of an integrated circuit packaging system comprising:
    providing a leadframe having an upper structure, upper protrusions, and a base side facing away from the upper structure and the upper protrusions;
    forming tie bars in the leadframe with an opening surrounding the upper structure, the tie bars connected to the upper structure and exposed on the base side;
    connecting an integrated circuit to the upper protrusions;
    applying an encapsulant over the integrated circuit, over the upper structure, and in the opening with the base side exposed;
    removing the tie bars exposing a first surface and a second surface of the encapsulant below the first surface, and forming a die paddle from the upper structure and exposed from the second surface; and
    removing the leadframe from the base side forming island terminals from the upper protrusions exposed from the second surface and isolated from the die paddle.

2. The method as claimed in claim 1 wherein forming the opening includes etching an undercut surface of the opening.

3. The method as claimed in claim 1 further comprising forming a base patterned layer on the base side.

4. The method as claimed in claim 1 wherein etching the portions of the base side includes forming the island terminals having a standoff height.

5. The method as claimed in claim 1 wherein applying the encapsulant includes covering a portion of an undercut surface of the opening with the encapsulant.

6. A method of manufacture of an integrated circuit packaging system comprising:
    providing a leadframe with an upper structure, upper protrusions, and a lowered surface with a base side, the upper structure and the upper protrusions integral with and above a side of the lowered surface opposite and facing away from the base side;
    forming an opening with tie bars in the leadframe, the opening surrounding the upper structure, the tie bars connected to the upper structure and the leadframe, a side of the tie bars exposed on the base side;
    connecting an integrated circuit to the side opposite the base side;
    applying an encapsulant over the integrated circuit device, over the lowered surface, and in the opening, the base side exposed from the encapsulant;
    etching the tie bars to form a first surface of the encapsulant, a second surface of the encapsulant below the first surface, and a die paddle covered by the encapsulant with a portion of the die paddle exposed from the second surface below the first surface; and
    etching portions of the base side to form island terminals surrounded by the encapsulant, the island terminals exposed from the second surface, the island terminals isolated from and surround the die paddle.

7. The method as claimed in claim 6 wherein forming the opening includes etching an undercut surface in portions of the opening.

8. The method as claimed in claim 6 wherein providing the leadframe includes attaching a portion of an outlined patterned layer on the upper structure.

9. The method as claimed in claim 6 wherein etching the portions of the base side includes forming the island terminals having a standoff height less than an insertion depth of the island terminals.

10. The method as claimed in claim 6 wherein applying the encapsulant includes covering a portion of an undercut surface of the opening with the encapsulant.

* * * * *